United States Patent [19]

Bahgat

[11] Patent Number: 4,568,916

[45] Date of Patent: Feb. 4, 1986

[54] VARIABLE WORD LENGTH ENCODER

[76] Inventor: Osama A. E. H. Bahgat, 520 Landreville - Apt. #1M, Nun's Island, Verdun, Quebec, Canada, H3E 1B4

[21] Appl. No.: 551,145

[22] Filed: Nov. 14, 1983

[51] Int. Cl.$^4$ .......................................... H03K 13/24
[52] U.S. Cl. ........................................... 340/347 DD
[58] Field of Search ................ 340/347 DD; 358/260, 358/261; 375/21, 25, 27

[56] References Cited

U.S. PATENT DOCUMENTS

| | | | |
|---|---|---|---|
| 4,060,797 | 11/1977 | Maxwell | 340/347 DD |
| 4,161,757 | 7/1979 | Spencer | 358/261 |
| 4,168,513 | 9/1979 | Hains | 358/261 |
| 4,396,906 | 8/1983 | Weaver | 340/347 DD |

OTHER PUBLICATIONS

Carta "IBM Technical Disclosure Bulletin", vol. 15, No. 12, May 1973, p. 3707.

Primary Examiner—Charles D. Miller

[57] ABSTRACT

An encoder is provided for encoding fixed length binary words into (VWL) encoded serial data in which each non-zero word comprises a start bit and an end bit of one state and a number of intervening bits of a different state, the number of such bits representing the magnitude of the word. In a preferred embodiment the coder comprises a multiplexer, a PROM and a flip-flop. The PROM provides a feedback signal comprising three parts - a control signal, a binary word representing the magnitude of the input word, and an output signal having either of two states. The feedback signal is repeatedly applied to the PROM by the multiplexer.

The PROM responds by reducing the magnitude part of the feedback signal by one. Each time the cycle repeats, another bit appears at the output of the coder as the output signal. Accordingly, the number of such output bits corresponds to the magnitude of the input word. Eventually, when the magnitude has been reduced to zero, the multiplexer selects a new word to apply to the PROM.

5 Claims, 5 Drawing Figures

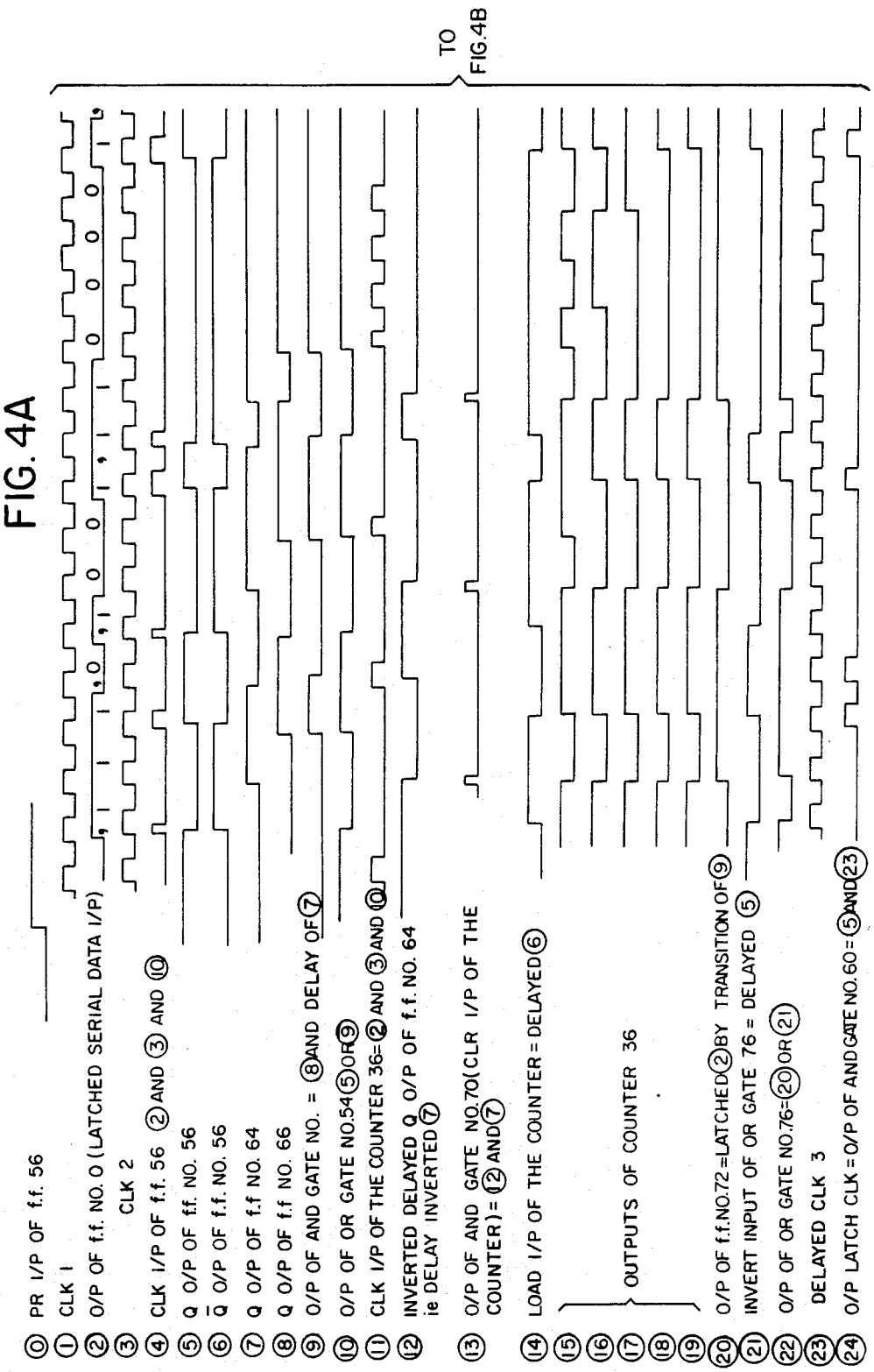

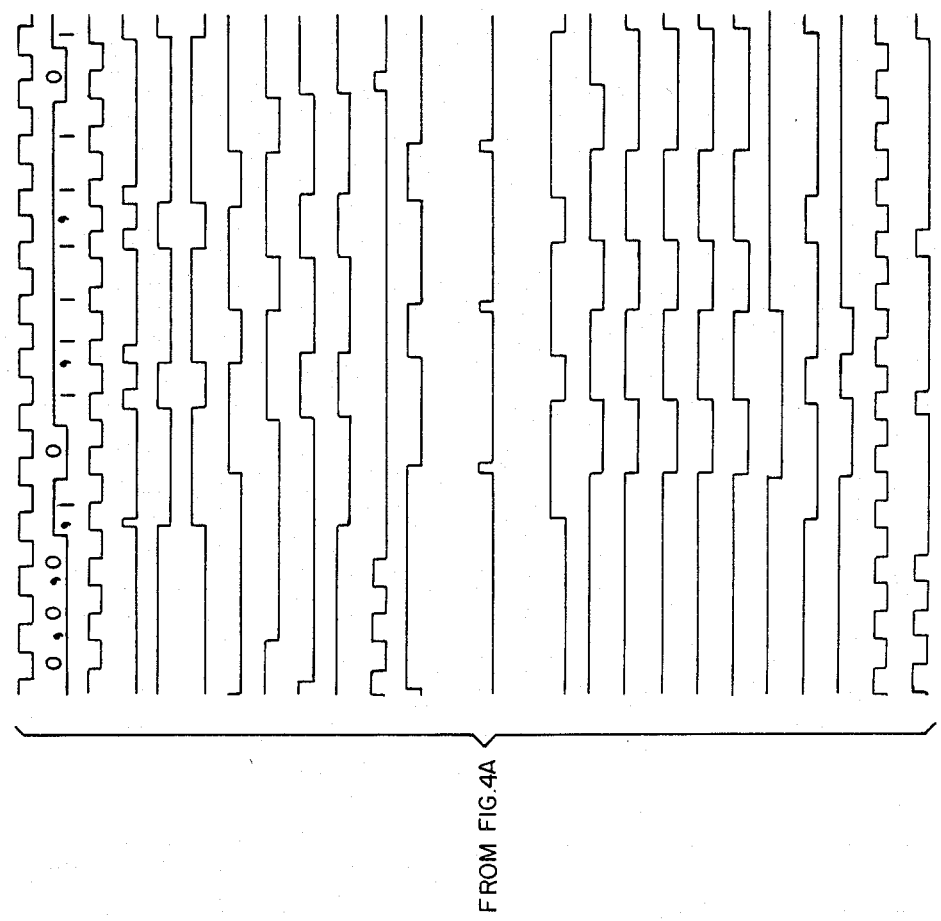

VARIABLE WORD LENGTH ENCODER

The invention relates to variable word length coders for digital signals and is especially, but not exclusively, applicable to predictive differential pulse code modulation systems for video or voice transmission and/or storage.

In such systems it is generally desirable to reduce the number of bits needed to be transmitted or stored while preserving the integrity of the reconstituted signal. In predictive systems this is achieved by transmitting a prediction error signal representing the difference between an instant signal element value and a predicted value derived from a number of preceding signal elements. There is usually a strong correlation between neighbouring values of a video or voice signal so the predicted value will generally be very close to the instant value. Consequently it is more probable that the prediction error signal will be zero, or small, then large. Nevertheless, the system must be capable of handling large prediction error signals as and when they occur. Hence, if the prediction error signal is quantized, the outer levels of the quantizer are rarely used. In order to avoid such inefficient use of the system capacity, it has been proposed to apply the prediction error signal to a variable word length coder which has shorter words assigned to the inner levels around zero, where the probability of data generation is high. Thus, on average, efficient transmission is achieved. One known possibility is to apply the output of the coder, in parallel form, to a parallel to serial converter and thence to a serial buffer memory. A disadvantage of such an arrangement is that the buffer memory must have a capacity and writing rate sufficient to accommodate the longest variable word length coded word at the basic system frequency. For example, if a clock frequency is 8 MHZ and the longest word is 25 bits long, then the rate of writing the data into the buffer memory varies between 8 megabits per second and 200 megabits per second. Accordingly, hardware to handle such a speed is difficult to realize. Moreover, difficulty arises in parallel to serial conversion when the size of the words at the input to the parallel to serial converter is inherently variable.

An object of the present invention is to eliminate or at least mitigate these disadvantages.

According to the present invention apparatus for variable word-length encoding of input signals comprising fixed length binary words, comprises:

(i) MEMORY MEANS responsive selectively to one or more of:
  (a) a said binary word of magnitude greater than zero, and a first control signal, to generate a feedback signal comprising a second control signal and a binary word corresponding in magnitude to the first-mentioned binary word, and an output signal comprising a bit having one of two possible states.
  (b) a binary word of magnitude greater than unity, and said second control signal, to generate a feedback signal comprising a binary word of magnitude one less than that of the binary word to which the memory means is responding and said second control signal, and an output signal comprising a bit having the other of said two possible states;
  (c) a binary word of magnitude equal to unity, and said second control signal, to generate a feedback signal comprising said first control signal and a binary word of magnitude zero, and an output signal comprising a bit having said one of two possible states;

(ii) SELECTION MEANS responsive to said first and second control signals to select said input signal and feedback signal, respectively and alternatively, for application to said memory means, and (iii) means for applying said feedback signal to said selection means.

An exemplary embodiment of the invention will now be described with reference to the accompanying drawings, in which.

FIGS. 4A and 4B together show a timing diagram for the decoder.

Figure 1:
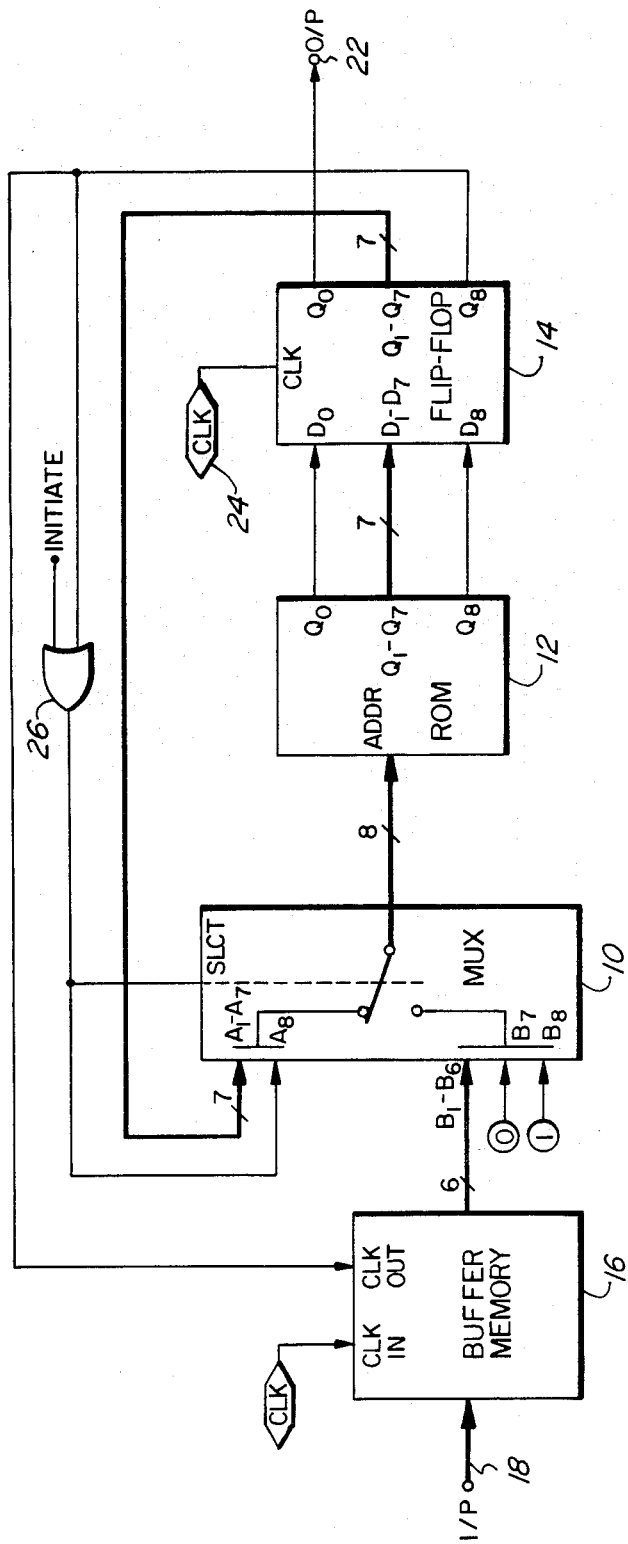
FIG. 1 is a schematic representation of a variable word length encoder deriving its input from a parallel buffer memory.

The decoder is the subject of copending application Ser. No. 551,087 of the same date as this application. Referring to FIG. 1, an encoder for encoding binary words of fixed length into words of variable length comprises selection means in the form of a multiplexer (MUX) 10, having two input sets, denoted A and B, each of eight inputs; memory means in the form of a read-only memory (ROM) 12; and output delay means in the form of a flip-flop 14. Six bit parallel signed binary words are supplied to the encoder from input storage means in the form of a parallel buffer memory 16, which has an input bus 18 to receive such words from a suitable source (not shown).

A typical source is the quantizer output of a predictive encoder as used in an adaptive differential pulse code modulation system. Table 1 illustrates, for levels ranging from $-13$ to $+13$, the signed binary representation of such a quantizer output. Each such binary word has one bit denoting its polarity and five bits representing its magnitude. It will be appreciated that although only thirteen levels are shown in the table, the five bits will give a range of 31 levels, and even greater ranges can be achieved merely by increasing the number of bits.

The third column of table 1 shows a typical variable length word for each level. It will be noted that the zero level is unique in that its corresponding output word is a single '0' bit. All other variable output words have in common a start bit (1), a polarity bit (1 or 0), end bit (1) and an intervening series of zero bits, the number of which depends upon the numerical level. More specifically, the number of zero bits is one less than the level number. Thus, the variable length words representing level one have no zero magnitude bits (note that the zero in the plus one representation is a polarity bit) and the words representing level thirteen have twelve intervening zero bits. As mentioned in the introduction, the utility of the code is predicted upon the fact that the quantizer output remains close to zero because of the correlation between neighbouring elements of the voice or video signal being encoded. Therefore, on average the output word will be shorter than the corresponding six-bit input word.

Referring again to FIG. 1, the binary words from the buffer memory 16 are applied by way of a six-line bus to inputs $B_1$ to $B_6$ of the multiplexer 10. The remaining two inputs of that set, $B_7$ and $B_8$, are maintained permanently at binary levels '0' and '1' respectively. This may be done by connecting inputs $B_7$ and $B_8$ to a low and a high voltage source, respectively. These two bits serve as a first control signal, as will be explained hereafter.

The corresponding eight-bit words output from the multiplexer 10 are applied to the address inputs of the ROM 12. Each produces a nine-bit output word at outputs $Q_0$–$Q_8$ respectively, of the ROM 12. Output $Q_0$ is coupled individually via the flip-flop 14 to the serial output terminal 22 of the encoder. ROM outputs $Q_1$ to $Q_7$ are applied by way of the flip-flop 14 to inputs $A_1$ to $A_7$ of the multiplexer 10. The most significant bit of the ROM output, $Q_8$, is coupled individually via the flip-flop 14 to the CLOCK-OUT input of the buffer memory 15, and to inputs $A_8$ and select (SLCT) of the multiplexer 10.

The flip-flop 14, which is controlled by a clock 24, serves to delay or store the ROM output during any one bit period for application to the output 22 and multiplexer 10 during the next bit period.

It will be appreciated, however, that the least significant bit from ROM output $Q_0$ might be applied, without delay, directly to the apparatus output 22.

Levels '1' and '0' at its SLCT input cause the multiplexer 10 to connect input sets 'B' and 'A', respectively, to the ROM address.

Operation of the apparatus may be initiated by means of an OR gate 26 interposed between the flip-flop 14 and the SLCT input of the multiplexer 10, whereby the multiplexer 10 can be made to select inputs B to receive a new binary word.

The apparatus has two basic modes of operation (i) and (ii) depending upon whether or not the binary word at the multiplexer's B inputs has a magnitude of zero.

Mode (i): As shown in Table 2, if the input word is (000000), after addition of the control signal (10), the corresponding ROM address will be (10000000). The corresponding ROM output is the same, with an additional zero as the least significant bit $Q_0$. Therefore, the variable word length representation appearing at the output terminal 22 will be a single (0). The feedback part of the ROM output, bits $Q_1$ to $Q_7$, will comprise a magnitude part (00000), a sign bit (0), a control bit (0), and the most significant bit, $Q_8$, will again be (1) as the multiplexer 10 will maintain selection of the B inputs for application to the ROM address and a new six-bit binary word will be clocked out of the buffer memory 16.

Mode (ii): If the new binary word has a non-zero magnitude, the apparatus operates cyclically for a series of bit periods, during which the variable length output word is generated serially by ROM output $Q_0$. In the first step of the series the ROM generates a (0) for the most significant bit $Q_8$, to select the A inputs for subsequent steps, and a (1) as the least significant bit $Q_0$, which is the first bit of the variable length output word.

Ignoring for the moment the second step, which is concerned only with detecting the polarity of the word to be encoded, it will be seen that in the third and, if any, subsequent steps, a second control signal, comprising a (0) as the most significant bit (generated by the ROM output in the preceding step) appears at the ROM address. So long as the associated magnitude is greater than unity, the corresponding ROM output will comprise the second control signal comprising a (0) in the most significant bit, a magnitude part having a numerical value of one less than that of the magnitude of the addressing word, and a (0) as the serial output $Q_0$. Accordingly, the apparatus "counts down" the binary input word and in the process generates a series of zeros in the variable length output word.

When the magnitude of the addressing word is unity, the corresponding ROM output comprises the first control signal comprising a (1) in the most significant bit again, a magnitude of zero, and a '1' as the serial output bit. This terminates the series of steps since the most significant bit $Q_8$ is (1), causing the multiplexer 10 to select inputs B again to input a new binary word from the buffer memory 16.

It will be appreciated that when the levels are plus or minus one, the magnitude of the input word is already zero. Accordingly, the third step is also the last and no string of zeros representing magnitude is generated. It will be noted that for level plus one there is a single zero in the variable length output word. However, this zero represents polarity. The polarity-representing bit always appears as the second bit of the variable length output word and is therefore generated in the second step.

As mentioned previously, in the first step of generating a non-zero word, the ROM output produces a (0) as the most significant bit, $Q_8$. In addition the ROM produces a (1) as the second most significant bit $Q_7$. Consequently, in the second step the ROM address comprises a second control signal comprising a (0) in the most significant bit and a third control signal comprising a (1) in the second most significant bit. The remainder of the address is the six-bit word, its sign and magnitude bits unchanged, as it was reproduced by the ROM output in the first step. The corresponding ROM output in the second step comprises, the second control signal comprising a (0) in the most significant bit, a (0) in the second most significant bit, the magnitude part of the address word, unchanged, and a serial output bit, $Q_0$, which is (1) or (0) depending upon the polarity of the word being encoded. It should be noted that the sign bit in the feedback signal can be with or without change because it is irrelevant after the completion of the second step. Thus the sign bit $Q_6$ will be (0) regardless of its value at the input.

It will be appreciated that, if the binary words to be encoded are all of the same polarity, the second step in the series can be omitted. It will also be appreciated that the polarity bit might be elsewhere in a non-unity output word, rather than the second bit. Moreover, rather than signify sign or polarity, the additional bit might characterize another feature of the word, for example, the additional bit might merely distinguish between words of similar probability of occurrence. Also, more than one additional bit might be used for these or other purposes.

Figure 2:
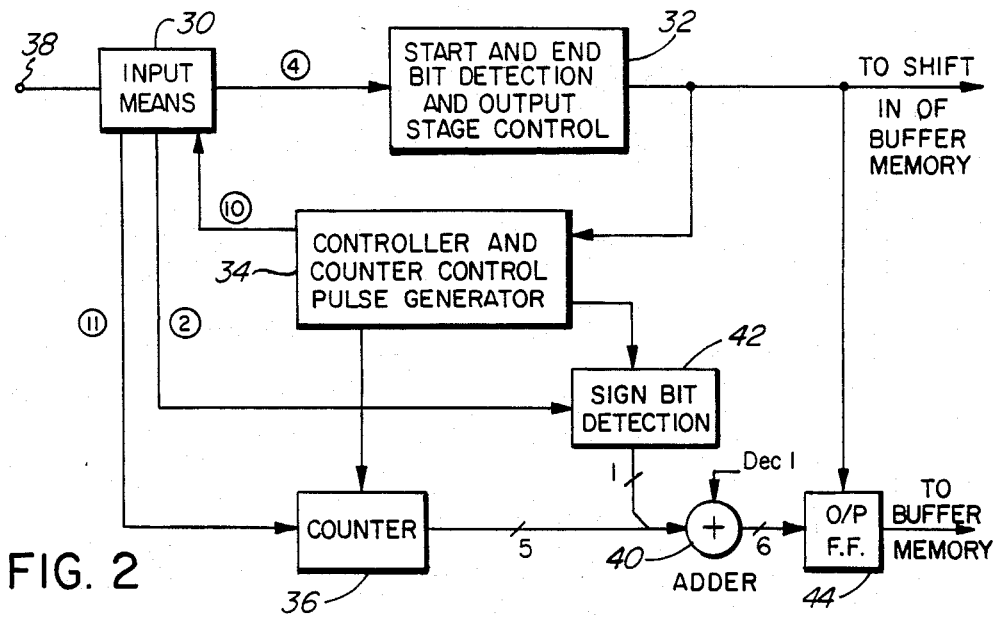
FIG. 2 is a schematic representation of a variable word length decoder, its output connected to a parallel buffer memory.

Referring now to FIG. 2, a decoder for converting serial variable word length (VWL) coded data to parallel binary form (see Table 1) comprises input means 30 which responds to the input variable length word and to first and second periodic timing signals or clock CLK1 and CLK2 to provide corresponding signals 2, 4 and 11 (see FIG. 3) for application to a sign bit detection means 42, a start and stop bit detection means 32, and to a counter 36, respectively. A controller 34, responsive to the output of the detection means 32, controls application of the signals 4 and 11 to the detection means 32 and counter 36, and also serves to apply pulses to the clear (CLR) input of the counter 36 so as to clear it at the beginning of each non-zero word.

The output of the counter 36 comprises five bits which are supplied by way of a five line bus to one input of an adder 40. A sixth bit, derived from sign bit detection means 42, is applied, as the most significant bit, to the same input of the adder 40. The second input of adder 40 is arranged to receive the binary (000001), representing decimal one. The output of the adder 40 is applied by way of a six line bus to output means 44 which is controlled by detection means 32 to latch the output of the adder 40, when the end bit of the variable length input word is received. The output means 44 may supply the parallel signed binary word to a buffer memory (not shown).

As previously described, there are three types of variable words, namely a single zero; a non-zero word comprising a start bit, an end bit and a polarity of sign bit and having a magnitude of unity; a non-zero word comprising a start bit, a polarity bit and an end bit, with a number of zero bits representing a magnitude greater than unity.

For a non-zero input word, the output of counter 36 is a five bit binary word representing the number of zeros in the variable length word at the input means 30. The sign bit, 1 or 0, is joined as the sixth bit. Then, since the number of zeros is equal to one less than the magnitude, (see Table 1), decimal 1 is added to the six bit word by adder 40.

Reference to Table 1 will show that the variable length word representing zero magnitude is a single zero and that its corresponding parallel binary word is (000000). To achieve this conversion, start and stop bit detection means 32 loads the counter 36 with (11111) and controller 34 inhibits application of the input means 30 output to the CLK input of counter 36. In addition, means 32 forces a polarity bit of 1 to be produced by sign bit detector 42. Accordingly, the six bit word applied to encoder 40 is (111111) which, after addition of 1 gives (000000) as the parallel signed binary output word corresponding to zero magnitude.

Figure 3:
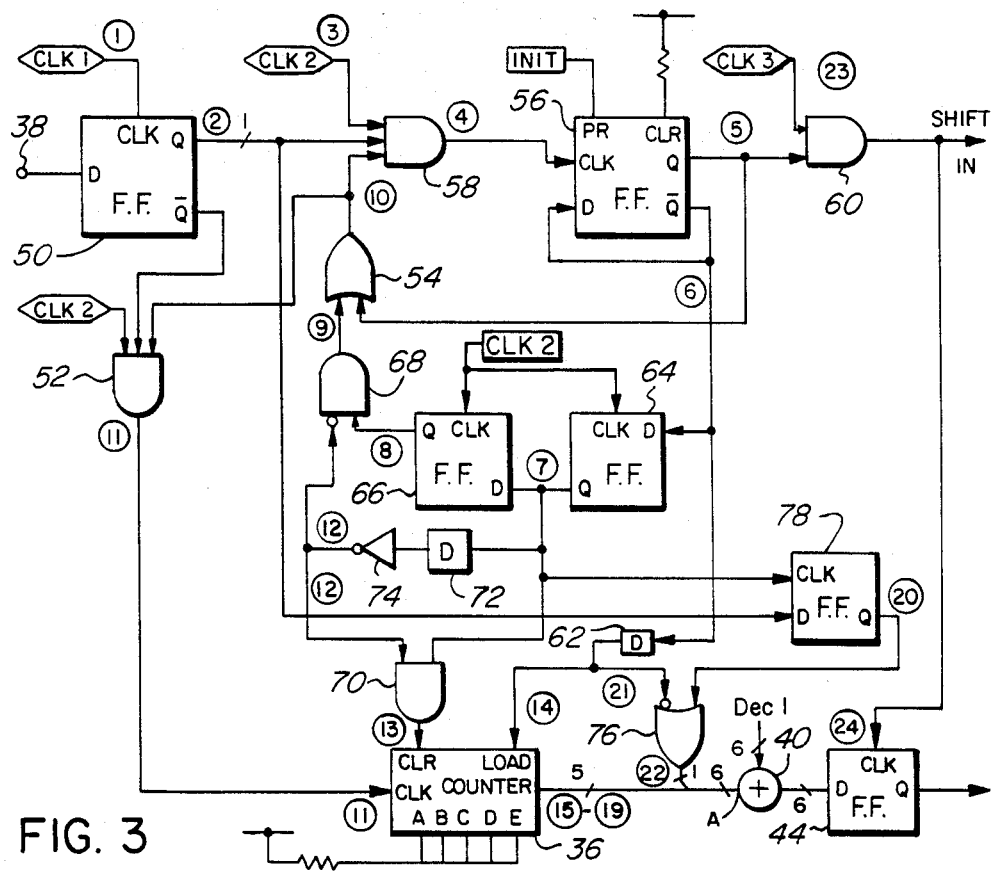
FIG. 3 is a more detailed diagram of the decoder.

The decoder is illustrated in more detail in FIG. 3. Input means 30 comprises a flip-flop 50 and three-input AND gates 52 and 58. The D input of flip-flop 50 is connected to the circuit serial VWL data input 38 and its Q and $\overline{Q}$ outputs are connected to inputs of AND gates 58 and 52, respectively. The flip-flop 50 is also connected to a periodic signal or clock CLK1 and a second input of AND gates 52 and 58 are connected to a clock CLK2 which is delayed relative to clock CLK1. The delay is sufficient to compensate for edge transitions and propagation delays and so will be determined according to the clock frequency and the particular devices used. The third input of AND gates 52 and 58 are connected to the output of an OR gate 54 in the controller 34. When AND gates 58 and 52 are enabled by the OR gate 54, they pass a combination of the input signal 2 and $\overline{2}$, respectively, and clock signal CLK2, as represented by signals 4 and 11 respectively, in FIG. 4. In practice gates 58 and 52 will only supply 1's when there are corresponding one and zero bits, respectively, in the input word. Gates 58 and 52 both operate in a similar manner, the former (58) serving 1's in the input signal and the latter (52) serving 0's.

Start and stop bit detection means 32 comprises a flip-flop 56, and a two input AND gate 60. The Q output of flip-flop 56 is connected to one input of OR gate 54 and to one input of AND gate 60, the other input of which is connected to a third clock, CLK3, which is delayed relative to clock CLK1, again to compensate for edge transitions and propagation delays. The output of AND gate 60 is connected to the CLK input of flip-flop 44 which contains six D-type flip-flop and comprises the output means. When AND gate 60 is enabled, the parallel binary word is latched into flip-flop 44 whose output comprises the output of the decoder.

The $\overline{Q}$ and D input of the flip-flop 56 are connected together and by way of a delay 62 to the LOAD input of counter 36 and an inverting input of an OR gate 76, which is part of the sign bit detection means 42. The parallel data inputs of the counter 36 are connected to a source of 1's so that when the $\overline{Q}$ output of flip-flop 56 goes low (which it does at the end of every non-zero word), the LOAD input goes low and the counter is filled with 1's. At the same time, since the inverting input of OR gate 76 is low, its output will be high so the six-bits applied to the adder will be (111111).

In addition to OR gate 54, previously mentioned, the controller 34 also comprises a pair of flip-flops 64 and 66, which serve as 1 bit delays, AND gates 68 and 70, delays 62 and 72, and inverter 74.

The $\overline{Q}$ of flip-flop 56 is connected to the D input of flip-flop 64, the Q output of which is connected to the D input of flip-flop 66. Both flip-flops 64 and 66 are clocked by clock CLK2.

The Q output of flip-flop 66 is connected to one input of AND gate 68, the output of which is connected to the second input of OR gate 54. The Q output of flip-flop 64 is also connected directly to one input of AND gate 70 and indirectly, by way of delay 72 and inverter 74, to the other input of gate 70. The output of inverter 74 is also connected to an inverting input of AND gate 68.

If a zero word appears at the input to the decoder, the outputs of flip-flop 56 will not change state. Thus its $\overline{Q}$ output will stay low and the controller will not be activated. The LOAD input of the counter 36 will stay low and the counter 36 will remain loaded with 1's as previously described. However, if a non-zero word is to be decoded, the start bit will cause flip-flop 56 to change state. This results in both inputs of OR gate 54 being low which inhibits the supply of input signals to both flip-flop 56 and the counter 36. In the next bit period a low to high transition appears at the output of flip-flop 64 (signal 7). Therefore a positive going pulse will be generated at the output of AND gate 70 and clears the counter 36. In the succeeding bit period AND gate 68 is enabled, and hence OR gate 54, which enables AND gates 52 and 58 to clock the input signal to counter 36 and flip-flop 56, respectively. Providing the input signal comprises zeroes, counter 36 will count them and flip-flop 56 will not change state. When the end or stop bit occurs, however, flip-flop 56 will change state and its Q output will go high enabling gate 60. Therefore the clock signal CLK3 will appear at the output of gate 60 and the output of the adder 40 will be latched into flip-flops 44. Also its $\overline{Q}$ output will be low so, after a short delay, the counter 36 will be loaded again with ones.

In addition to OR gate 76, sign bit detection means 42 comprises a flip-flop 78 having its output connected to one input of OR gate 76. Its CLK input is connected to the Q output of flip-flop 64 and its D input is connected to the Q output of flip-flop 50 in the input means 30. The sign or polarity bit is the second bit of the variable length word so when the low to high transition (at the start of the second bit) appears at the CLK input of the sign bit flip-flop 78, it will latch whatever bit is then appearing at the D input, which is the second bit of the variable length word at the Q output of flip-flop 50. This polarity bit is then transferred by way of OR gate 76 to the adder 40 for combination with the output of the counter 36.

The operating sequence of the decoder for several different input words will now be described with reference to the accompanying timing diagram, FIG. 4.

Step 1. At the start of decoding, the initial condition is that the Q output of the divide-by-two flip-flop 56 is high, its $\overline{Q}$ output is low, and the Q output of each of the flip-flops 64 and 66 is low. This may be achieved by holding the preset PR input of flip-flop 56 low for at least two clock periods or by presetting flip-flop 56 and clearing flip-flops 64 and 66.

Hence the output of OR gate 54 will be high—which enables AND gates 58 and 52, to feed input bits to the divide-by-two flip-flop 56 and the counter 36, respectively. Also, the outputs of flip-flops 64 and 66 will be low, thus forcing the outputs of AND gates 68 and 70 to be low, and the LOAD input of the counter 36 will be low, thereby loading it with (11111).

Step 2. The decoder must be initiated by a non-zero word before receiving the first word of serial data which may be a "zero" word. Otherwise if the first input words are zeroes they will be ignored by the decoder. In normal operation of the VWL coder-decoder system, there will usually be a marker signal that indicates the start of the serial data. Obviously, this marker signal is a non-zero word.

Step 3. Just after the arrival of the first bit of the new word there will be a low to high transition of the delayed clock CLK2.

Assume the new word is non-zero, and has a value 111 as illustrated in the timing diagram FIG. 4. The first bit of the new word will be high (the start bit). Hence the output signals 4 and 11 of AND gates 58 and 52 will be CLK2, (signal 4) and low, respectively. With the low to high transition of signal 4 at the CLK input of flip-flop 56, there will be a change in state of its outputs. Its Q output, signal 5, will go from high to low, and its $\overline{Q}$ output, signal 6, will go from low to high. Meanwhile the outputs of flip-flops 64 and 66 will remain low. Now the low at the Q output of flip-flop 56 will disable AND gate 60 preventing any output from the circuit. Also, both inputs of OR gate 54 are now low, so its output will be low, disabling gates 52 and 58.

The change of state of flip-flop 56 also causes the LOAD input of counter 36 to go high, and the invert input of OR gate 76 will thus be low.

Step 4. With the low to high transition of the second pulse of clock CLK2, the output of flip-flop 64 will change to high while that of flip-flop 66 will remain low. Hence a pulse will appear briefly at the output of AND gate 70, thereby clearing the contents of counter 36. Also, the low to high transition of the output of flip-flop 64 appearing at the CLK input of flip-flop 78 will latch the second bit of the VWL serial data input word, which is the sign bit, into flip-flop 78. This is a '1' which will appear at the corresponding input of OR gate 76. The level of its output will be the same as that of flip-flop 78 and hence the same as the sign bit.

Step 5a. With the positive-going edge to the third pulse of clock CLK2, the output of flip-flop 64 will remain high and that of flip-flop 66 will change from low to high. Hence the output of AND gate 68 will be high, changing the output of the OR gate 54 to high, thereby enabling AND gates 52 and 58.

As the present non-zero word is equal to $-1$ (i.e. "111"), the third input word bit will be high, indicating the end of the word.

Step 5b. Therefore, when gate 58 is enabled, a low to high transition of CLK2 will appear at the CLK input of flip-flop 56, thereby changing its state. Hence the Q output of flip-flop 56 will switch to high, enabling output AND gate 60. The counter 36 had merely been cleared so its output is (00000). The A input to the adder will be (100000). Therefore, the output of the adder 40 will be (100001) for a VWL input word 111 (i.e. $-1$). Then with the low to high transition of clock CLK3 appearing at the output of AND gate 60, the output of the adder 42 will be latched into flip-flop 44, and thence supplied from the decoder output to, for example, a buffer memory. Note that just after the latching of the output of adder 40 into flip-flop 44, the delayed Q output of flip-flop 56, which is low, will appear at the LOAD input of the counter 36, thereby loading it with (11111). The VWL decoder is now ready to accept the first bit of new word and reverts to step 3, above.

If the input word is 101, representing $+1$, the sign bit is zero. Therefore the output of OR gate 76 will be a zero and the input to adder 42 will be (000000). Its output will be (000001).

Assume that the next word is zero as shown in FIG. 4. It will comprise only one bit of low level. This will disable AND gate 58. Consequently, the Q output of flip-flop 56 will remain low keeping the LOAD input of the counter 36 at low level. Hence the output of the counter will remain (11111) and the output of OR gate 76 will be high (due to its input being the inverse of the counter LOAD input). Therefore the A input of adder 40 is (111111). After addition of decimal 1, the output of the adder will be (000000). Since the Q output of flip-flop 56 is now high, AND gate 60 is enabled. Thus with the positive-going edge of clock CLK3, the output of the adder will be latched into flip-flop 44 which provides the output of the decoder for application to the buffer memory (if required). The decoder will then revert to the beginning of step 3.

The next input word in FIG. 4 is equal to $+2$, i.e. (1001) so the input VWL word has zero or low bit after the sign bit. This means that steps 3 and 4 will be the same as described for an input word 111, except that the sign bit is different. Thereafter, the third bit, being low, will disable gate 58 and enable gate 52. Therefore the next low to high transition of clock signal 3 appears at the CLK input to the counter 36, thereby incrementing it by 1. The counter output, therefore, is equal to (00001).

Step 6. With the positive-going edge of the fourth pulse of clock CLK2, the outputs of flip-flops 64 and 66 will remain high, keeping AND gates 52 and 58 enabled. The word is equal to $+2$ so the fourth bit will be high indicating the end of the word. The process described in Step 5b above will be repeated. However, in this case, since the counter has been incremented by 1, the output of the adder 40 will be (000010) for input word (1001).

If the input word is greater than $+2$ or $-2$, it will be handled in the same way, but for every additional zero in the input word there will be another low to high transition at the CLK input to the counter 36, incrementing it each time by 1. Therefore, the output of the counter 36 will be equal to the number of zeroes.

TABLE I

Signed Binary Representation and VWL Representation of the Quantizer Levels

| INPUT LEVEL | SIGNED BINARY REPRESENTATION | OUTPUT - VARIABLE WORD LENGTH REPRESENTATION | WORD LENGTH |
|---|---|---|---|
| −n | s MAGNITUDE<br>i<br>g<br>n | s<br>i<br>g<br>n | n+2 |
| −13 | 1 0 1 1 0 1 | 1 1 0 0 0 0 0 0 0 0 0 0 0 0 1 | 15 |
| −12 | 1 0 1 1 0 0 | 1 1 0 0 0 0 0 0 0 0 0 0 0 1 | 14 |
| −11 | 1 0 1 0 1 1 | 1 1 0 0 0 0 0 0 0 0 0 0 1 | 13 |
| −10 | 1 0 1 0 1 0 | 1 1 0 0 0 0 0 0 0 0 0 1 | 12 |
| −9 | 1 0 1 0 0 1 | 1 1 0 0 0 0 0 0 0 0 1 | 11 |
| −8 | 1 0 1 0 0 0 | 1 1 0 0 0 0 0 0 0 1 | 10 |
| −7 | 1 0 0 1 1 1 | 1 1 0 0 0 0 0 0 1 | 9 |
| −6 | 1 0 0 1 1 0 | 1 1 0 0 0 0 0 1 | 8 |
| −5 | 1 0 0 1 0 1 | 1 1 0 0 0 0 1 | 7 |
| −4 | 1 0 0 1 0 0 | 1 1 0 0 0 1 | 6 |
| −3 | 1 0 0 0 1 1 | 1 1 0 0 1 | 5 |
| −2 | 1 0 0 0 1 0 | 1 1 0 1 | 4 |
| −1 | 1 0 0 0 0 1 | 1 1 1 | 3 |
| 0 | 0 0 0 0 0 0 | 0 | 1 |
| 1 | 0 0 0 0 0 1 | 1 0 1 | 3 |
| 2 | 0 0 0 0 1 0 | 1 0 0 1 | 4 |
| 3 | 0 0 0 0 1 1 | 1 0 0 0 1 | 5 |
| 4 | 0 0 0 1 0 0 | 1 0 0 0 0 1 | 6 |
| 5 | 0 0 0 1 0 1 | 1 0 0 0 0 0 1 | 7 |
| 6 | 0 0 0 1 1 0 | 1 0 0 0 0 0 0 1 | 8 |
| 7 | 0 0 0 1 1 1 | 1 0 0 0 0 0 0 0 1 | 9 |
| 8 | 0 0 1 0 0 0 | 1 0 0 0 0 0 0 0 0 1 | 10 |
| 9 | 0 0 1 0 0 1 | 1 0 0 0 0 0 0 0 0 0 1 | 11 |
| 10 | 0 0 1 0 1 0 | 1 0 0 0 0 0 0 0 0 0 0 1 | 12 |
| 11 | 0 0 1 0 1 1 | 1 0 0 0 0 0 0 0 0 0 0 0 1 | 13 |
| 12 | 0 0 1 1 0 0 | 1 0 0 0 0 0 0 0 0 0 0 0 0 1 | 14 |
| 13 | 0 0 1 1 0 1 | 1 0 0 0 0 0 0 0 0 0 0 0 0 0 1 | 15 |
| n | | | n+2 |

Note:
6-bit wide signed binary input is shown in the table. However, the width of the signs binary input can assume any value up to infinity.

TABLE 2

EXAMPLES TO ILLUSTRATE THE OPERATION OF THE VWL CODER

| INPUT LEVEL | STEP # | INPUT B CONTROL | | SIGN | MAGNITUDE | | | | | INPUT A CONTROL | | SIGN | MAGNITUDE | | | | | | SELECT INPUT 1=B / 0=A |
|---|---|---|---|---|---|---|---|---|---|---|---|---|---|---|---|---|---|---|---|
| | | $B_8$ | $B_7$ | $B_6$ | ← | ← | ← | ← | $B_1$ | $A_8$ | $A_7$ | $A_6$ | ← | ← | ← | ← | $A_1$ | $Q_8$ | |
| −8 | 1 | 1 | 0 | 1 | 0 | 1 | 0 | 0 | 0 | 1 | X | X | X | X | X | X | X | | B |
| | 2 | 1 | 0 | 0 | 0 | 0 | 1 | 0 | 0 | 0 | 1 | 1 | 0 | 1 | 0 | 0 | 0 | | A |
| | 3 | 1 | 0 | 0 | 0 | 0 | 1 | 0 | 0 | 0 | 0 | 0 | 0 | 1 | 0 | 0 | 0 | | A |
| | 4 | 1 | 0 | 0 | 0 | 0 | 1 | 0 | 0 | 0 | 0 | 0 | 0 | 0 | 1 | 1 | 1 | | A |
| | 5 | 1 | 0 | 0 | 0 | 0 | 1 | 0 | 0 | 0 | 0 | 0 | 0 | 0 | 1 | 1 | 0 | | A |
| | 6 | 1 | 0 | 0 | 0 | 0 | 1 | 0 | 0 | 0 | 0 | 0 | 0 | 0 | 1 | 0 | 1 | | A |
| | 7 | 1 | 0 | 0 | 0 | 0 | 1 | 0 | 0 | 0 | 0 | 0 | 0 | 0 | 1 | 0 | 0 | | A |
| | 8 | 1 | 0 | 0 | 0 | 0 | 1 | 0 | 0 | 0 | 0 | 0 | 0 | 0 | 0 | 1 | 1 | | A |
| | 9 | 1 | 0 | 0 | 0 | 0 | 1 | 0 | 0 | 0 | 0 | 0 | 0 | 0 | 0 | 1 | 0 | | A |
| | 10 | 1 | 0 | 0 | 0 | 0 | 1 | 0 | 0 | 0 | 0 | 0 | 0 | 0 | 0 | 0 | 1 | | A |
| +4 | 1 | 1 | 0 | 0 | 0 | 0 | 1 | 0 | 0 | 1 | 0 | 0 | 0 | 0 | 0 | 0 | 0 | | B |
| | 2 | 1 | 0 | 0 | 0 | 0 | 0 | 0 | 1 | 1 | 0 | 0 | 0 | 1 | 0 | 0 | 0 | | A |
| | 3 | 1 | 0 | 0 | 0 | 0 | 0 | 0 | 1 | 0 | 0 | 0 | 0 | 1 | 0 | 0 | 0 | | A |
| | 4 | 1 | 0 | 0 | 0 | 0 | 0 | 0 | 1 | 0 | 0 | 0 | 0 | 0 | 1 | 1 | 1 | | A |
| | 5 | 1 | 0 | 0 | 0 | 0 | 0 | 0 | 1 | 0 | 0 | 0 | 0 | 0 | 1 | 1 | 0 | | A |
| | 6 | 1 | 0 | 0 | 0 | 0 | 0 | 0 | 1 | 0 | 0 | 0 | 0 | 0 | 0 | 0 | 1 | | A |
| +1 | 1 | 1 | 0 | 0 | 0 | 0 | 0 | 0 | 1 | 1 | 0 | 0 | 0 | 0 | 0 | 0 | 0 | | B |
| | 2 | 1 | 0 | 0 | 0 | 0 | 0 | 0 | 0 | 0 | 1 | 0 | 0 | 0 | 0 | 0 | 1 | | A |
| | 3 | 1 | 0 | 0 | 0 | 0 | 0 | 0 | 0 | 0 | 0 | 0 | 0 | 0 | 0 | 0 | 1 | | A |
| 0 | 1 | 1 | 0 | 0 | 0 | 0 | 0 | 0 | 0 | 1 | 0 | 0 | 0 | 0 | 0 | 0 | 0 | | B |
| 0 | 1 | 1 | 0 | 0 | 0 | 0 | 0 | 0 | 0 | 0 | 0 | 0 | 0 | 0 | 0 | 0 | 0 | | B |
| −1 | 1 | 1 | 0 | 1 | 0 | 0 | 0 | 0 | 1 | 1 | 0 | 0 | 0 | 0 | 0 | 0 | 0 | | B |
| | 2 | 1 | 0 | 0 | 0 | 1 | 1 | 1 | 1 | 0 | 1 | 1 | 0 | 0 | 0 | 0 | 1 | | A |
| | 3 | 1 | 0 | 0 | 0 | 1 | 1 | 1 | 1 | 0 | 0 | 0 | 0 | 0 | 0 | 0 | 1 | | A |

| INPUT LEVEL | STEP # | PROM address SLCT | CONTROL SIGN | MAGNITUDE | | | | | | PROM out & F. F. out FEEDBACK PART | | | | | | | SERL o/p |
|---|---|---|---|---|---|---|---|---|---|---|---|---|---|---|---|---|---|
| | | | | | | | | | $Q_8$ | $Q_7$ | $Q_6$ | ← | ← | ← | ← | $Q_1$ | $Q_0$ |
| −8 | 1 | 1 | 0 | 1 | 0 | 1 | 0 | 0 | 0 | 0 | 1 | 1 | 0 | 1 | 0 | 0 | 1 |
| | 2 | 0 | 1 | 1 | 0 | 1 | 0 | 0 | 0 | 0 | 0 | 0 | 0 | 1 | 0 | 0 | 1 |

TABLE 2-continued
EXAMPLES TO ILLUSTRATE THE OPERATION OF THE VWL CODER

|     |    |   |   |   |   |   |   |   |   |   |   |   |   |   |   |   |   |   |
|-----|----|---|---|---|---|---|---|---|---|---|---|---|---|---|---|---|---|---|
|     | 3  | 0 | 0 | 0 | 0 | 1 | 0 | 0 | 0 | 0 | 0 | 0 | 0 | 0 | 1 | 1 | 1 | 0 |
|     | 4  | 0 | 0 | 0 | 0 | 0 | 1 | 1 | 1 | 0 | 0 | 0 | 0 | 0 | 1 | 1 | 0 | 0 |
|     | 5  | 0 | 0 | 0 | 0 | 0 | 1 | 1 | 0 | 0 | 0 | 0 | 0 | 0 | 1 | 0 | 1 | 0 |
|     | 6  | 0 | 0 | 0 | 0 | 0 | 1 | 0 | 1 | 0 | 0 | 0 | 0 | 0 | 1 | 0 | 0 | 0 |
|     | 7  | 0 | 0 | 0 | 0 | 0 | 1 | 0 | 0 | 0 | 0 | 0 | 0 | 0 | 0 | 1 | 1 | 0 |
|     | 8  | 0 | 0 | 0 | 0 | 0 | 0 | 1 | 1 | 0 | 0 | 0 | 0 | 0 | 0 | 1 | 0 | 0 |
|     | 9  | 0 | 0 | 0 | 0 | 0 | 0 | 1 | 0 | 0 | 0 | 0 | 0 | 0 | 0 | 0 | 1 | 0 |
|     | 10 | 0 | 0 | 0 | 0 | 0 | 0 | 0 | 1 | 1 | 0 | 0 | 0 | 0 | 0 | 0 | 0 | 1 |
| +4  | 1  | 1 | 0 | 0 | 0 | 0 | 1 | 0 | 0 | 0 | 1 | 0 | 0 | 0 | 1 | 0 | 0 | 1 |
|     | 2  | 0 | 1 | 0 | 0 | 0 | 1 | 0 | 0 | 0 | 0 | 0 | 0 | 0 | 1 | 0 | 0 | 0 |
|     | 3  | 0 | 0 | 0 | 0 | 0 | 1 | 0 | 0 | 0 | 0 | 0 | 0 | 0 | 0 | 1 | 1 | 0 |
|     | 4  | 0 | 0 | 0 | 0 | 0 | 0 | 1 | 1 | 0 | 0 | 0 | 0 | 0 | 0 | 1 | 0 | 0 |
|     | 5  | 0 | 0 | 0 | 0 | 0 | 0 | 1 | 0 | 0 | 0 | 0 | 0 | 0 | 0 | 0 | 1 | 0 |
|     | 6  | 0 | 0 | 0 | 0 | 0 | 0 | 0 | 1 | 1 | 0 | 0 | 0 | 0 | 0 | 0 | 0 | 1 |
| +1  | 1  | 1 | 0 | 0 | 0 | 0 | 0 | 1 | 0 | 1 | 0 | 0 | 0 | 0 | 0 | 0 | 1 | 1 |
|     | 2  | 0 | 1 | 0 | 0 | 0 | 0 | 1 | 0 | 0 | 0 | 0 | 0 | 0 | 0 | 0 | 1 | 0 |
|     | 3  | 0 | 0 | 0 | 0 | 0 | 0 | 1 | 1 | 0 | 0 | 0 | 0 | 0 | 0 | 0 | 0 | 1 |
| 0   | 1  | 1 | 0 | 0 | 0 | 0 | 0 | 0 | 1 | 0 | 0 | 0 | 0 | 0 | 0 | 0 | 0 | 1 |
| 0   | 1  | 1 | 0 | 0 | 0 | 0 | 0 | 0 | 1 | 0 | 0 | 0 | 0 | 0 | 0 | 0 | 0 | 0 |
| −1  | 1  | 1 | 0 | 1 | 0 | 0 | 0 | 1 | 0 | 1 | 0 | 0 | 0 | 0 | 1 | 1 | 0 | 1 |
|     | 2  | 0 | 1 | 1 | 0 | 0 | 0 | 1 | 0 | 0 | 0 | 0 | 0 | 0 | 0 | 0 | 1 | 1 |
|     | 3  | 0 | 0 | 0 | 0 | 0 | 0 | 1 | 1 | 0 | 0 | 0 | 0 | 0 | 0 | 0 | 0 | 1 |

NOTE:
These examples illustrate the operation of a VWL coder which operates for signed binary words of length 6 bits each. However, the VWL coder can operate for any size of signed binary input words.
X = irrelevant

What is claimed is:

1. Apparatus for variable-word-length encoding of input signals comprising fixed length binary words, comprising:
   (i) MEMORY MEANS responsive selectively to:
      (a) an input signal comprising a first binary word and and a first control signal and
      (b) a feedback signal comprising a second binary word and, alternatively, at least said first and a second control signal
      for generating said feedback signal and an output signal comprising a binary bit;
   (ii) SELECTION MEANS responsive to said first and second control signals to select said input signal and said feedback signal, respectively and alternatively, for application to said memory means; and
   (iii) MEANS FOR APPLYING said feedback signals to said selection means,
   the arrangement being such that
   (a) when responding to a said input signal in which said first binary word has a magnitude greater than zero, said memory means causes said feedback signal to comprise said second control signal, said second binary word to correspond in magnitude to the first binary word and said output bit to have a prescribed one of its states;
   (b) when responding to a feedback signal comprising a said second binary word having a magnitude greater than unity and said second control signal, said memory means causes said feedback signal next generated to comprise said second control signal and a binary word of magnitude one less than that applied to the memory means and said output signal comprises a binary bit having the other of two states;
   (c) when the feedback signal comprises a binary word of magnitude equal to unity, and said second control signal, the memory means generates a feedback signal comprising said first control signal, a binary word of magnitude zero, and an output signal comprising a bit having said one state;
   such that for each input binary word of non-zero magnitude, said apparatus generates an output comprising a sequence of bits comprising a first bit in said one of two possible states followed by (m-1) bits in said other of two possible states, followed by a final bit in said one of two possible states, where m is the magnitude of said input binary word.

2. Apparatus as defined in claim 1, wherein said memory means is responsive to said input signal comprising said first control signal and a binary word greater than zero to generate a feedback signal additionally comprising a third control signal, and is subsequently responsive to the feedback signal so generated, additionally comprising said third control signal to generate a feedback signal comprising said second control signal, a binary word having the same value, and an output signal comprising a bit having a state dependent upon a predetermined characteristic of the binary word in said input signal.

3. Apparatus as defined in claim 2, wherein said binary word in said input signal comprises a polarity bit and said memory means in responsive to said polarity bit in generating said output signal.

4. Apparatus as defined in claim 1, 2 or 3, wherein said memory means is further responsive selectively to:
   a binary word of magnitude zero and said first control signal to generate a feedback signal comprising said binary word of magnitude zero and said first control signal, and an output signal comprising a bit representing zero.

5. Apparatus as defined in claim 1, further comprising:
   delay means responsive to said memory means for generating said feedback signal delayed by one bit period.

* * * * *